United States Patent [19]

Vogt et al.

[11] Patent Number: 5,770,974
[45] Date of Patent: Jun. 23, 1998

[54] THERMAL COMPENSATION CIRCUIT AFFECTING AMPLIFIER GAIN

[75] Inventors: Stephan W. Vogt; John W. Brickell, both of Lawrenceville; Alfredo Acosta, College Park, all of Ga.

[73] Assignee: Scientific-Atlanta, Inc., Norcross, Ga.

[21] Appl. No.: 657,199

[22] Filed: Jun. 3, 1996

[51] Int. Cl.[6] ................................ H03F 1/30; H03F 3/26
[52] U.S. Cl. ..................... 330/272; 330/271; 330/283; 330/289
[58] Field of Search .................... 330/265, 266, 330/271, 272, 282, 283, 285, 304

[56] References Cited

U.S. PATENT DOCUMENTS

| | | |
|---|---|---|
| 2,802,071 | 8/1957 | Lin . |
| 2,860,193 | 11/1958 | Lindsay . |
| 2,866,017 | 12/1958 | Jones . |
| 2,889,416 | 6/1959 | Shea . |
| 2,934,641 | 4/1960 | Lin . |
| 2,972,114 | 2/1961 | Silberbach . |
| 3,204,191 | 8/1965 | Redwood . |
| 3,235,784 | 2/1966 | Kordes et al. . |
| 3,370,244 | 2/1968 | Higginbotham . |
| 3,431,507 | 3/1969 | Zirwas ................................ 320/289 |
| 3,484,867 | 12/1969 | Babcock . |
| 3,831,102 | 8/1974 | Medal . |
| 3,898,575 | 8/1975 | Koch . |
| 4,140,976 | 2/1979 | Wartofsky . |
| 4,243,946 | 1/1981 | Wang ................................ 330/266 X |
| 4,423,391 | 12/1983 | Ebenhoeh ........................ 330/283 X |
| 5,477,188 | 12/1995 | Chawla et al. ..................... 330/272 X |

FOREIGN PATENT DOCUMENTS

| 1377509 | 9/1964 | France ................................ 330/289 |
|---|---|---|
| 1219534 | 6/1966 | Germany ............................ 330/289 |

*Primary Examiner*—James B. Mullins
*Attorney, Agent, or Firm*—Kenneth M. Massaroni; Kelly A. Gardner

[57] ABSTRACT

The present invention solves the gain, noise figure, and distortion problems of prior art thermal compensation circuits by incorporating a temperature-compensating circuit in the feedback loop of a transistor amplifier arrangement. Using this method, the insertion loss is reduced as the gain of the amplifier varies proportionately to the temperature. This method has a negligible effect on the noise figure and distortion, and the incremental cost is much lower than the conventional circuits. Furthermore, the present invention can be used in both single-ended or push-pull dual amplifier configurations.

9 Claims, 2 Drawing Sheets

THERMAL COMPENSATION CIRCUIT AFFECTING AMPLIFIER GAIN

FIELD OF THE INVENTION

The present invention relates to a circuit that provides thermal compensation for passive electronic gain elements in a transmission path of a telecommunication system. In particular, the instant invention is directed to a thermal compensation circuit that affects the gain of an amplifier configuration as the gain characteristics of the amplifier fluctuate over temperature.

BACKGROUND OF THE INVENTION

Conventionally, in the transmission of RF signals via a transmission medium, such as, for example, coaxial cable, fiber optic cable, and the like, equalizer networks are used to compensate for different characteristics of the transmission medium as a function of frequency, temperature, and other characteristic-affecting conditions. Typically, coaxial cable used in such transmission systems presents significant variations of its transmission characteristics over the transmission bandwidth of the system. In other words, the signals are attenuated to a greater extent at the high end of the frequency band than at the low end. Equalizers are typically used to compensate for such variations. In addition to frequency sensitivity, the cable also exhibits a change in attenuation as a function of temperature. In the prior art, such additional temperature variation was compensated for by including, in the line equalizer, several temperature-sensitive components.

Similarly, the transmission network generally comprises a number of amplifier stages cascaded along its length to maintain signal strength and integrity along the line from the head-end to the receiver station. Recently, emphasis has been placed on using leftover bandwidth from the forward direction transmission, i.e., from head-end to receiver, to provide so-called "reverse-path" communication from the receiver from the head-end, thereby expanding the capability of the system with additional features, such as, for example, on-demand pay-per-view programming, and the like in cable television systems.

There has been increased use of reverse-path capability in telecommunication systems for more sensitive data transfer, in addition to carrying reverse-path video signals. Accordingly, amplifiers have been needed to ensure signal strength and integrity in the reverse path, as well as in the forward transmission path. The reverse-path amplifiers are also subject to characteristic variations over temperature. In some cases, the change in signal level over the operational temperature range causes performance degradation to the point where the system will cease to function properly.

The level changes are caused by cable attenuation and reverse-amplifier gain changes over temperature. Currently, it is uncommon to compensate for these variations in the reverse path. In cases where thermal compensation is implemented, the prior art generally employs a thermal compensation circuit using a standard equalizer configuration, as described above. Such a prior art equalization circuit is described in U.S. Pat. No. 3,569,869 to Sutton, Jr., et al., entitled "Thermal Compensation For A Radio Frequency Transmission Line."

The Sutton technique, and other similar techniques, create an insertion loss that is typically at least as great as the amount of high-temperature compensation. This problem manifests itself as an increased noise level and/or increased distortion, in addition to the loss of gain. To overcome the loss in order to achieve more gain requires either a higher gain transistor circuit or a higher gain hybrid that typically exhibits a worse distortion characteristic, in addition to having the disadvantages of added cost and complexity.

SUMMARY OF THE INVENTION

The present invention provides a thermal compensation circuit that compensates for variations in gain of an amplifier over temperature. This is not to be confused with bias compensation, which merely maintains configuration bias of components as they are affected by temperature. The temperature compensation circuit of the present invention provides gain compensation for an amplifier over temperature without creating unduly high levels of insertion loss. In another embodiment of the invention, by coupling the emitters of a push-pull amplifier configuration, via the thermal compensation circuit, only one compensation circuit is required, further reducing insertion loss, while providing gain compensation and decreasing overall system complexity and cost.

By incorporating a temperature-compensating circuit in the feedback loop of the amplifier, the thermal compensation circuit of the present invention solves the problems of gain loss, noise, and distortion that are present in conventional thermal compensation systems. Using the circuit configuration of the present invention, insertion loss is reduced to a negligible level by causing the gain of the amplifier to vary proportionally with the temperature of the amplifier. Furthermore, the circuit configuration of the present invention has a negligible effect on the noise figure and distortion. Additionally, the incremental cost for employing the configuration of the present invention is much lower than the conventional solutions to thermal variation, because it incorporates a single thermal compensation circuit without the need for separate equalization circuits, and the like.

Accordingly, it is an object of the present invention to provide thermal compensation to affect the gain of an amplifier.

It is another object of the instant invention to decrease the insertion loss associated with implementing the thermal compensation circuit of the present invention.

Yet another object of the present invention is to provide a thermal compensation circuit that reduces the noise figure associated therewith, as compared with conventional systems.

Still another object of the invention is to minimize distortion in the amplified signal caused by introducing a thermal compensation circuit into the transmission path.

It is also an object of the present invention to reduce the cost and complexity of conventional systems by providing a simple, inexpensive, yet highly effective, thermal compensation circuit configuration in the transmission path.

These and other objects, and their attendant advantages thereof, are achieved by the present invention, which provides an amplifier circuit, including: an amplifier comprising a transistor; a thermal compensation circuit connected to the amplifier to provide thermal compensation feedback signal to the amplifier, the feedback signal being representative of a temperature of the amplifier and causing the amplifier to adjust an RF gain thereof in accordance with the temperature signal, said thermal compensation circuit including a thermistor and a resistor connected in parallel.

BRIEF DESCRIPTION OF THE DRAWINGS

The invention will be described herein with reference to the following figures, in which like reference numerals refer to like elements throughout the various views, and wherein.

DETAILED DESCRIPTION OF PREFERRED EMBODIMENTS

Passive components used to provide gain in the transmission path of a telecommunication system have characteristics that vary with temperature. For example, RF levels in passive amplification components will tend to change with changes in temperature. Specifically, in transistor amplifiers, the RF level will decrease as temperature increases. Accordingly, the present invention is directed to providing a feedback circuit that compensates for the natural fluctuation in amplification characteristics over temperature. This is particularly important in reverse-path applications where increasingly sensitive data is being transmitted, requiring improved maintenance of signal strength and integrity. Another consideration that must be addressed is the tendency for compensating circuits to increase insertion loss, noise, and distortion. The present invention solves the gain, noise figure, and distortion problems by incorporating a temperature-compensating circuit in a feedback loop of the transistor amplifiers. Using this approach, insertion loss is virtually eliminated as the gain of the amplifier varies proportionally to the detected temperature. It is noted that the detected temperature is generally that of the amplifier housing. However, the temperature being sensed can be selected by the system designer to compensate for whatever temperature is affecting the amplifier gain. Additionally, the approach taken in the instant invention has a negligible effect on the noise figure, distortion, and the incremental cost of employing the circuit of the instant invention is much lower than the cost of conventional methods. Moreover, the circuit of the present invention is equally useful in both single-ended or push-pull amplifier configurations.

Figure 1:
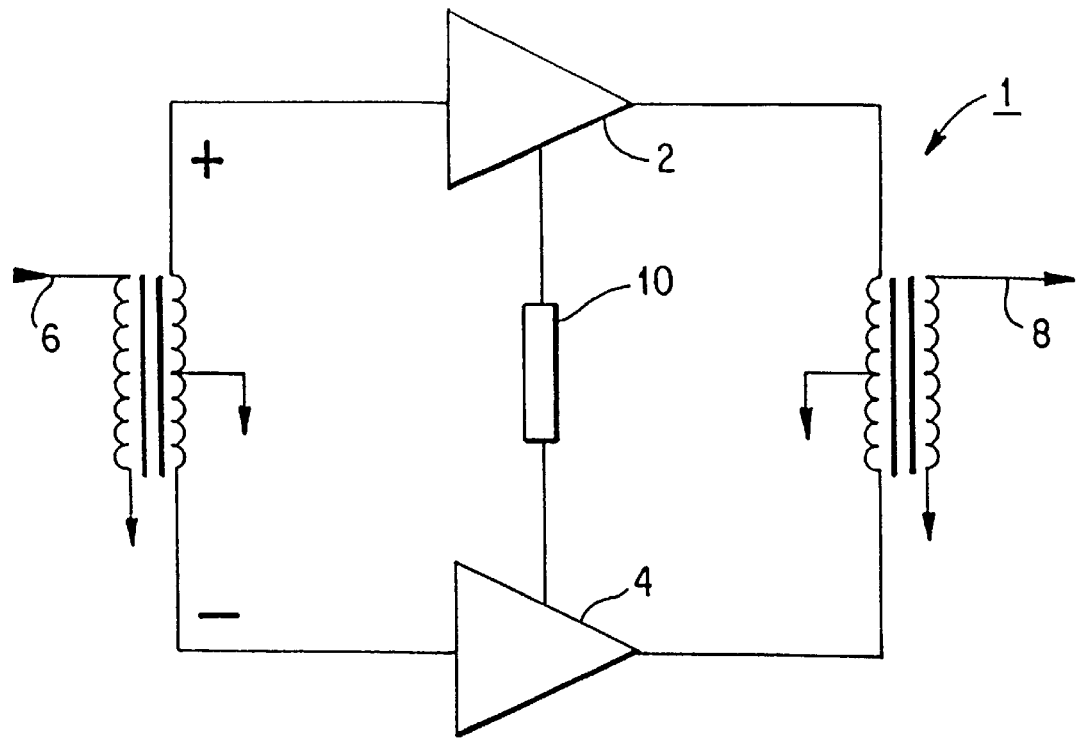
FIG. 1 is a schematic diagram of an embodiment of the present invention.

Referring now to FIG. 1, a block diagram of a push-pull amplifier arrangement 1, according to an embodiment of the present invention, is shown. An input signal is applied to a transformer 6. The signal is split into two signals, each of which is 180° out of phase of the other. The input to the top amplifier 2 is positive with respect to the bottom amplifier 4. The temperature compensation circuit 10 is placed in a feedback loop between the out-of-phase emitters of both amplifier stages 2, 4. The temperature-varying component (not shown) of the temperature-compensating circuit 10 changes the feedback ratio of the amplifiers 2, 4. The variable feedback ratio, in turn, changes the gain in proportion to the temperature. The amount of feedback and temperature compensation is dependent upon component values of the temperature-compensating circuit 10, and these values will be readily ascertainable to those skilled in the art, depending upon the operational conditions of the system. The output of each amplifier 2, 4 is recombined at transformer 8, which provides the temperature-compensated output signal for the circuit 1.

Figure 2:
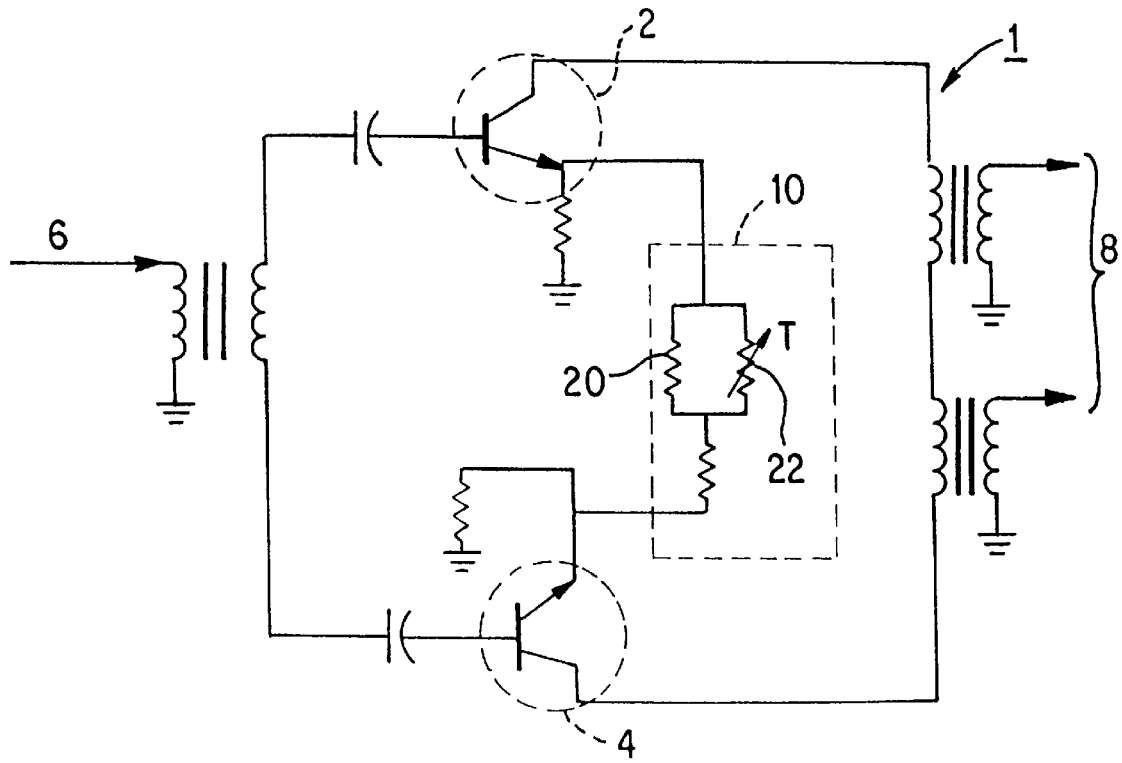
FIG. 2 is a circuit diagram showing details of the present invention.

FIG. 2 shows details of a preferred circuit configuration of the instant invention. The amplifiers 2, 4 are emitter-coupled via temperature-compensating circuit 10. Using this configuration provides the advantage of having to use only one compensating circuit 10, thereby improving insertion loss, noise, figure, and distortion characteristics of the invention.

The temperature-compensating circuit 10 includes a thermistor 22 arranged in parallel with a resistor 20. The values and characteristics of the resistor-thermistor pair 20, 22, are matters of design choice that are readily ascertainable to those skilled in the art.

Figure 3:
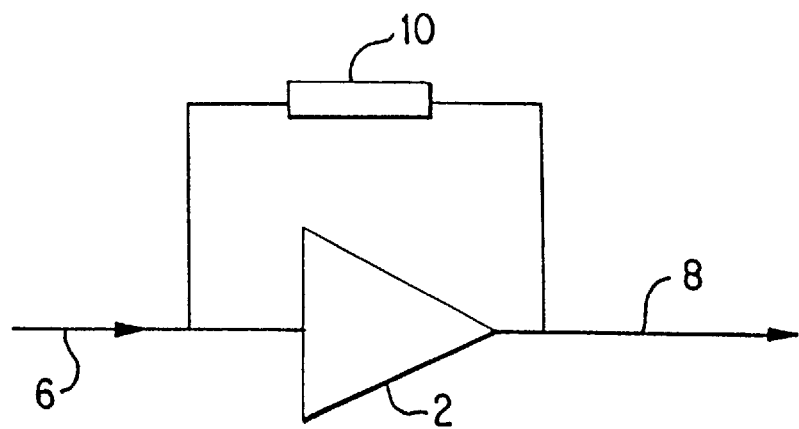
FIG. 3 is a block diagram of an alternative embodiment of the present invention.

FIG. 3 shows a block diagram of another embodiment of the invention having a single-ended amplifier configuration. The temperature-compensating circuit 10 provides a feedback signal to the amplifier 2 to provide temperature-compensated output 8, the input signal applied at point 6.

Figure 4:
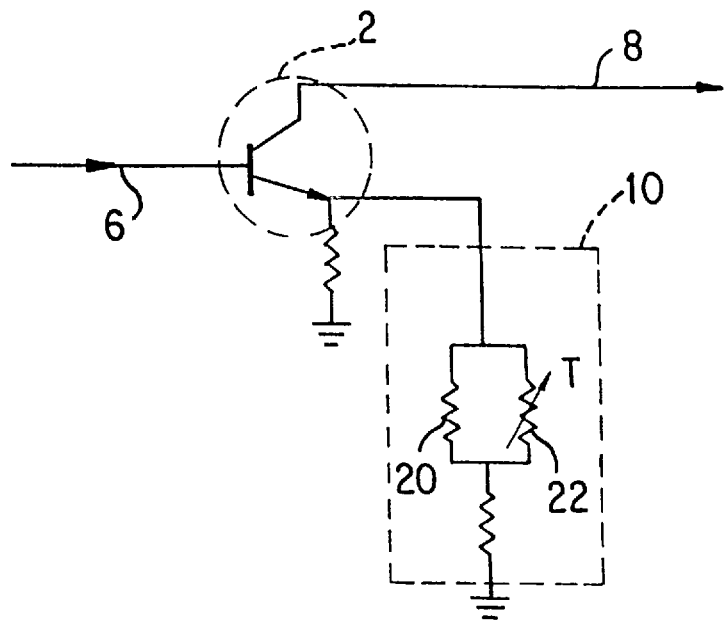
FIG. 4 is a schematic representation of the embodiment shown in FIG. 3.

FIG. 4 is a schematic representation of the configuration shown in FIG. 3. The temperature compensating circuit 10 is the same as that described above with respect to the embodiment shown in FIGS. 1 and 2.

While the invention has been described with respect to a reverse transmission path, it will be understood that the principles of the present invention apply equally to forward transmission paths. Furthermore, any U.S. patents referred to herein should be deemed to be incorporated by reference as to any subject matter believed to be necessary for an understanding of the present invention.

While this invention has been described in conjunction with specific embodiments thereof, it is evident that many alternatives, modifications, and variations will be apparent to those skilled in the art. Accordingly, the preferred embodiments of the invention, as set forth herein, are intended to be illustrative, not limiting. Various changes may be made without departing from the true spirit and full scope of the invention, as defined in the following claims.

What is claimed is:

1. An amplifier circuit, comprising:
    an amplifier comprising a push-pull amplifier circuit, said push-pull amplifier circuit comprising a first amplifier, a second amplifier, and an input stage connected to said first and second amplifiers and providing a signal to said second amplifier that is 180 degrees out of phase with a signal provided to said first amplifier; and
    a thermal compensation circuit connected to provide a feedback signal being representative of a temperature of said amplifier and causing said amplifier to adjust a RF gain thereof in accordance with a temperature signal, said thermal compensation circuit being coupled to an emitter of each of said first and second amplifiers.

2. The amplifier circuit of claim 1, wherein said amplifier and thermal compensation circuit operate to keep a gain at a temperature compensated level.

3. The amplifier circuit of claim 1, wherein said thermal compensation circuit further compensates for cable loss over temperature.

4. The amplifier circuit of claim 1, wherein said thermal compensation circuit comprises a thermistor.

5. The amplifier circuit of claim 4, wherein said thermal compensation circuit further comprises a resistor connected in parallel with said thermistor.

6. The amplifier circuit of claim 1 wherein each of said first and second amplifiers comprises a transistor.

7. The amplifier circuit of claim 6, wherein said thermal compensation circuit is connected to an emitter of each of said first and second amplifiers.

8. The amplifier circuit of claim 7, wherein said thermal compensation circuit comprises a thermistor.

9. The amplifier circuit of claim 8, wherein said thermal compensation circuit further comprises a resistor connected in parallel with said thermistor.

* * * * *